United States Patent [19]

Grandmont et al.

[11] Patent Number: 5,015,553
[45] Date of Patent: May 14, 1991

[54] METHOD OF PATTERNING RESIST

[75] Inventors: Paul E. Grandmont, Franklin; Harold Lake, Sharon, both of Mass.

[73] Assignee: The Foxboro Company, Foxboro, Mass.

[21] Appl. No.: 489,789

[22] Filed: Mar. 5, 1990

Related U.S. Application Data

[63] Continuation of Ser. No. 6,624, Jan. 22, 1987, abandoned, which is a continuation-in-part of Ser. No. 742,742, Jun. 10, 1985, Pat. No. 4,666,818.

[51] Int. Cl.$^5$ .............................. G03C 1/90; G03C 1/68
[52] U.S. Cl. ...................................... 430/260; 430/261; 430/273; 430/503
[58] Field of Search ................. 430/260, 261, 273, 503

[56] References Cited

U.S. PATENT DOCUMENTS

| | | | |
|---|---|---|---|
| 3,511,657 | 5/1970 | Smith | 96/50 |
| 3,567,445 | 3/1971 | Atkinson et al. | 96/33 |
| 3,578,451 | 5/1971 | Doggett | 430/155 |
| 3,607,346 | 9/1971 | Darlow et al. | 117/34 |
| 3,764,329 | 10/1973 | Lee | 96/67 |
| 3,867,150 | 2/1975 | Ketley | 96/36.3 |
| 4,168,980 | 9/1979 | LaRossa | 96/114.1 |
| 4,299,912 | 11/1981 | Shiba et al. | 430/302 |
| 4,347,305 | 8/1982 | Shiba et al. | 430/302 |
| 4,358,530 | 11/1982 | Shiba | 430/273 |
| 4,409,316 | 10/1983 | Zeller-Pendrey | 430/263 |
| 4,477,562 | 10/1984 | Zeller-Pendrey | 430/513 |
| 4,515,877 | 5/1985 | Barzynski et al. | 430/5 |
| 4,555,471 | 11/1985 | Barzynski et al. | 430/273 |
| 4,666,818 | 5/1987 | Lake et al. | 430/256 |
| 4,670,374 | 6/1987 | Bellus et al. | 430/505 |

FOREIGN PATENT DOCUMENTS

| | | |
|---|---|---|
| 3509747 | 9/1986 | Fed. Rep. of Germany . |
| 462286 | 3/1937 | United Kingdom . |
| 1068557 | 5/1967 | United Kingdom . |
| 1411423 | 10/1975 | United Kingdom . |

OTHER PUBLICATIONS

Derwent Abstract of W. German Publ. No. 3509747, 1986.

*Primary Examiner*—Richard L. Schilling
*Attorney, Agent, or Firm*—Fish & Richardson

[57] ABSTRACT

A CAD driven photoplotter selectively exposes a photographic imaging layer without affecting the underlying UV sensitive resist on a substrate to make a printed wiring board, for example. The image layer is developed on the board and used as an in situ mask for the underlying UV resist during exposure to UV. After UV exposure, the image layer is peeled off to allow conventional processing of the resist. The in situ mask is preferably applied in the form of a baseless, high contrast, high gamma emulsion layer bonded to the protective cover sheet over the uncured resist. To facilitate application, the emulsion layer is carried by a release paper which is removed before photoplotting. After UV exposure, the cover sheet and emulsion layer are integrally peeled from the resist.

4 Claims, 11 Drawing Sheets

FIG. 1A PLOT

FIG. 1B DEVELOP

FIG. 1C UV

FIG. 1D PEEL FILM

FIG. 1E REMOVE SOFT RESIST

FIG. 1F ETCH Cu

FIG. 1G REMOVE HARD RESIST

FIG. 4A   PATTERN Cu. FOIL

FIG. 4B   APPLY FILM/PDF COMPOSITE

FIG. 4C   PLOT, DEV., UV & PEEL

FIG. 4D   REMOVE UNEXPOSED PDF

FIG. 4E   SOLDER BATH

FIG. 4F   PLATE UP (ALTERNATIVE STEP AFTER 4D)

FIG. 5A

FIG. 5B  PLOT, DEV., UV & PEEL

FIG. 5C  REMOVE SOFT RESIST

FIG. 5D  ELECTROPLATE Cu., TIN-SOLDER

FIG. 5E  REMOVE HARD RESIST

FIG. 5F  ETCH BACKGROUND Cu.

FIG. 17E (ALTERNATIVE AFTER 17C)

FIG. 17F (ALTERNATIVE AFTER 17C)

METHOD OF PATTERNING RESIST

CROSS-REFERENCE TO RELATED APPLICATION

This is a divisional continuation-in-part of copending application Ser. No. 07/006,624 filed on Jan. 22, 1987, now abandoned which is a continuation-in-part of copending application Ser. No. 742,742 filed June 10, 1985, U.S. Pat. No. 4,666,818 entitled "Method of Patterning Resist" by the same inventors assigned to the assignee of the present application.

BACKGROUND OF THE INVENTION

The invention relates generally to the manufacture of printed wiring boards for electrical components and more particularly to photoprocessing techniques for printed wiring boards.

The ongoing integration and miniaturization of components for electronic circuitry has become a growing challenge to the limits of printed wiring board technology over the last twenty years. Printed circuit boards or printed wiring boards (PWB) as they are more accurately termed, play several key roles. First, the electrical components, such as specially packaged integrated circuits, resistors, etc., are mounted or carried on the surface of the flat usually sturdy card-like board. Thus, the PWB serves as a support for the components. Secondly, using chemically etched or plated conductor patterns on the surface of the board, the PWB forms the desired electrical interconnections between the components. In addition, the PWB can include a metal area serving as a heat sink.

Conductor patterns are typically formed by photo-etching a copper foil clad epoxy fiberglass substrate. A photoresist layer is applied to the copper foil and patterned by exposure to untraviolet (UV) light projected through a mask, often referred to as "artwork". Areas exposed on the photoresist are polymerized. The unpolymerized areas are removed by a chemical solution leaving areas of copper, the desired conductor pattern, underneath the protective barrier of the remaining polymerized hardened photoresist. The exposed copper is then etched away and the remaining photoresist is chemically removed to expose the resulting conductor pattern. Alternatively, the photoresist can be patterned to form channels for electroless plating of conductor patterns. There are, of course, many variations on this procedure, but all of them require photo-patterning of the resist layer.

As the use of integrated circuits has grown, the higher density of interconnection terminals for inputs and outputs (I/O) has necessitated double-sided PWB's in which additional interconnections are made employing conductor patterns on the other side of the board.

Along with increased circuit integration, surface mount technology (SMT) has accelerated the densification of electronic circuitry. Surface mount devices (SMD) are applied directly to the surface of the PWB and soldered using vapor phase, infra-red (IR) or other techniques. SMT is revolutionizing the electronics manufacturing industry by reducing assembly cost by about 50%, increasing component density by over 40% and enhancing reliability. The array of terminals on SMD's has a higher density or finer pitch than those on conventional components. As each terminal still has to be properly electrically connected to the respective conductor on the board, registration of SMD's requires high resolution for the PWB conductor lines. Indeed, SMD circuitry has become so dense that double-sided boards cannot accommodate all of the needed electrical connections. Thus, multilayer PWB's have become the focus of attention and several competing technologies are evolving. Those technologies which rely on stacks or layers of conductor patterns have interlayer registration requirements in addition to the exacting line width and spacing of a conductor pattern in a given layer. Manufacturing very fine lines on the order of 3 to 5 mils in registration over four or more layers deep is very difficult.

To take fullest possible advantage of the benefits offered by the emerging SMT, new fabrication processes must be developed in the manufacture of substrates and boards. In the past, one of the problem areas in fabrication of PWB's has been the generation and use of artwork masters for patterning the photoresist layers. Using photographic film or glass plates poses inherent difficulties in stability, registration, transport and storage.

The elimination of artwork masters from the board fabrication process has long been an industry goal, one which fostered the development of high-speed UV laser plotters. Several machines are currently available; all are very expensive and in an early stage of development. These machines pattern the UV sensitive resist directly without artwork. Conductor patterns are designed using computer-assisted design (CAD) which digitizes the coordinates and dimensions of all of the paths and converts them to control signals for a UV laser x-y plotter. In addition to their very high cost, these systems have a number of limitations which become significant in fine line, high density work. Principal among these is the fact that UV sensitive resists are low contrast materials, requiring high levels of exposure energy. As a result, line edge resolution is limited. In order to achieve high plot speeds, these systems all operate in a raster scan mode. Raster scanning produces considerable edge irregularities which are very apparent in plotting angled lines. Limitations in accuracy and minimum line width are characteristic of these raster plotting systems. Another problem area in current systems is the short life expectancy of the laser source. A further problem with direct from CAD UV plotting of the photoprocessable layer is that it does not permit inspection before polymerization. If an error is made in the plot, the mistake is indelibly embedded in the UV sensitive layer. In the case of a resist, the board may be salvaged only by removing the entire resist layer and starting over after cleaning and baking the board free of moisture a second time. In the case of a UV plotted solder mask, a glitch in the pattern results in the entire panel being discarded.

SUMMARY OF THE INVENTION

Accordingly, the general object of the invention is to eliminate separate artwork masters which must be manipulated in the board fabrication process while avoiding the edge resolution problems of direct UV plotters. A further object of the invention is to provide extremely fine line patterning with minimal interlayer misregistration at lower cost and higher speed, using inherently more reliable equipment.

These and other objects of the invention are achieved by a system which offers a highly simplified means of substrate/board fabrication driven directly from a CAD layout. The process utilizes a very thin high contrast photosensitive strippable film laminated directly onto a substrate coated with a photoprocessable layer such as resist or a permanent insulating material. Alternatively, the photoprocessable layer and film are co-laminated initially and applied as a composite to the substrate. The resulting structure can be exposed onboard from CAD using a conventional low energy white light plotter which cannot effect significant polymerization in the underlying resist layer. After exposure, the film layer is developed onboard using conventional film developing chemistry or another process appropriate to the film type used. Development does not disturb the underlying resist. The resultant high contrast film image forms an in situ mask for subsequent uniform UV flood exposure of the underlying resist. After UV exposure, the film is removed, preferably by peeling it off of the substrate. Further processing of the substrate may be carried out by conventional means. The process can be repeated for multiple layering with no registration errors induced by manipulating separate artwork masters. The system may also employ a raster scan plotter. In one embodiment an octagonal spot makes straight edged lines at 45° or 90° to the scan direction. Because the film exhibits high contrast, low intensity light is adequate for exposure, yielding extremely fine resolution unlike direct UV patterning of the underlying resist. Thus, the invention combines the benefits of CAD driven plotters with onboard direct pattern formation but yields a sharper pattern by virtue of using high contrast, low energy, white light plotting. Moreover, the visible image on the developed film is fully inspectable before UV exposure and available for touch up if necessary. If the image is unacceptable, the film can be peeled off and unexposed film reapplied. The system also can be used to pattern solder masks or permanent dry film insulating layers, and the like, in the same manner as for resists.

The in situ mask is ideally applied according to the invention in the form of a baseless emulsion layer with high gamma and high contrast at low energy exposure levels. The emulsion layer can be bonded directly to the protective cover sheet over the uncured resist, or a releasably adherent emulsion layer can be applied directly to the resist. In either case, the emulsion layer is carried by a release paper which facilitates application to the resist. Double-sided release paper allows the emulsion composite to be wound on a roll. Alternatively, the emulsion layer can be sandwiched between two sheets of release paper, one of which is stripped away to reveal the emulsion layer before it is applied to the resist. The upper release paper covering the emulsion layer is removed before photoplotting. Where a cover sheet is employed on the resist, after UV exposure, the cover sheet and emulsion layer are integrally peeled from the resist. The resist and emulsion layer may be formed together as a composite laminate with the cover sheet preferably sandwiched between the emulsion layer and resist. Release paper can be added to the resist/emulsion composite for easy application to the metal layer on the board.

DETAILED DESCRIPTION

Figure 1A:
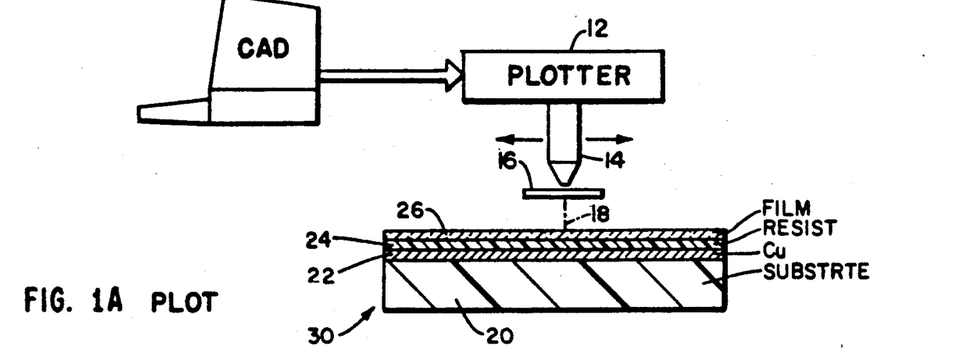
FIGS. 1A–1G are diagrammatic cross-sectional views of a PWB undergoing a sequence of steps for patterning the photoresist directly from CAD using an etched pattern subtractive technique.

As shown in FIG. 1A, the design of a conductor pattern for a layer of a PWB is rendered on CAD 10. The PWB may be any size up to a typical maximum of 18 by 24 inches. The coordinates of the pattern are digitized and transmitted in a compatible digital form as the control input to an x-y plotter 12, for example, a Gerber Model 35. Plotters of this type, typically used for making artwork masters, have a moving table (not shown) to which the film is affixed. The table is capable of translational motion simultaneously in the x and y axes by means of separate x and y stepper motors and screw drives. The plotting head consists of a white light source 14 with a number of selectable apertures and in the present case a yellow filter 16 to remove the unwanted UV component. The plotter is set up in a dark room and the beam of light 18, moving relative to the film, "writes" a pattern of lines, usually of varying widths, on the film.

As shown in FIG. 1A, substrate 20, for example, an epoxy fiberglass sheet, carries a uniform layer of metal, e.g., copper 22. A photoresist layer 24 sensitive to UV light is superimposed on the copper layer 22. A thin sheet of strip base photographic film 26 overlays the photoresist 24. Film 26 is preferably one-quarter to one-half mil thick.

Figure 2:
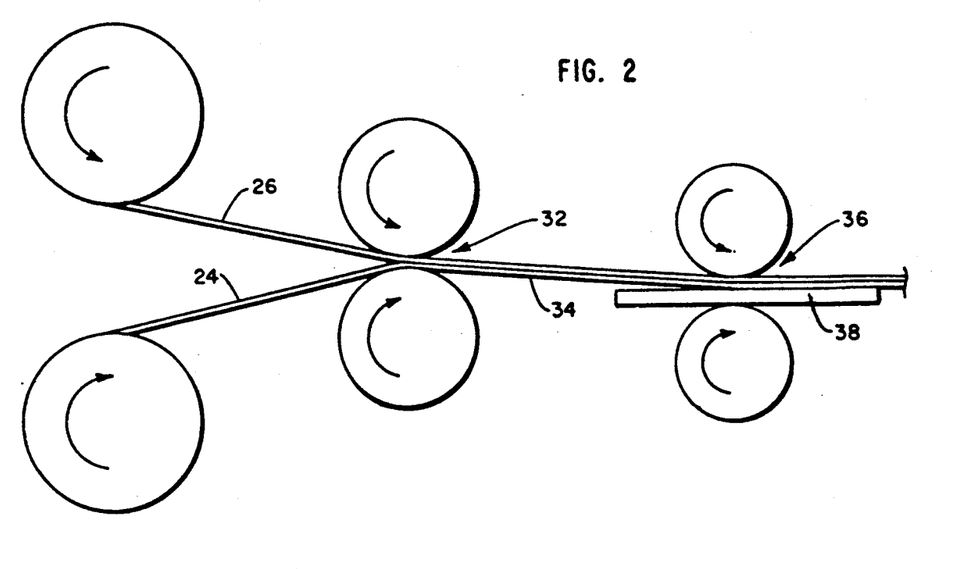
FIG. 2 is a diagrammatic functional representation of a system for prelaminating the resist and photographic film together before application to a substrate as a composite.
Figure 3:
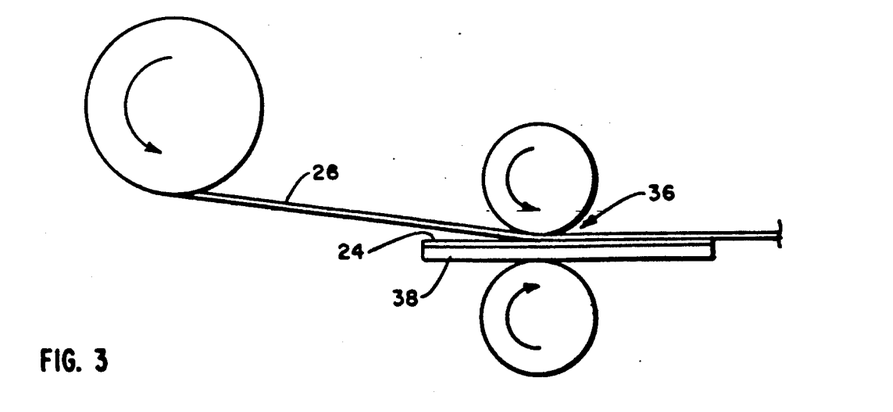
FIG. 3 is a diagrammatic functional representation of a system for applying the photographic film to a resist coated substrate.

The composite structure 30 of FIG. 1A can be prepared in several different ways. As shown in FIG. 2, the resist 24 and film 26 can be laminated by hot rolling at 32 to form a composite two ply sheet 34 which is then roll-laminated at 36 onto an uncoated substrate 38. Alternatively, as shown in FIG. 3, the photographic film 26 can be roll-laminated directly to a resist coated substrate.

In either case, the resulting structure 30 is mounted on the moving table (not shown) of the plotter 12 and the film 26 is exposed by the beam 18.

Figure 1B:
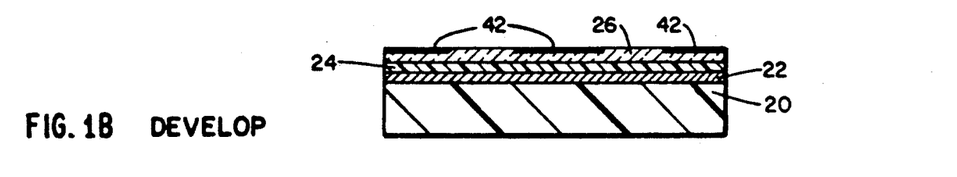

Once exposed, the film 26 is developed (FIG. 1B) using conventional photographic developing chemistry, for example, by immersing the entire structure 30 in the required sequence of baths in the darkroom. The image 42 develops in the upper emulsion layer of the thin film 26.

The film 26 may be a strip base silver film. A suitable film in negative or positive working form is available from The 3-M Company. Chemical development of the film does not affect the integrity of the particular underlying resists used, preferably semi-aqueous or solvent-type resist.

A possibly superior film for use in connection with this invention is a dry silver imaging film. This type of film, also available from The 3-M Company, is photosensitive to white light and has relatively high contrast, but does not require chemicals for development of the image. The image is developed by heating the film either at elevated temperatures for a brief period or at relatively moderate temperatures for a longer period of time. Because of this property, dry silver film has very poor archival properties as it becomes fogged after a period of time even at moderately elevated temperatures. This type of film may be ideal, however, for the present invention because it can be applied with the emulsion side down in contact with the substrate, e.g., the resist or solder mask. By placing the emulsion side directly against the photoprocessable layer, the in situ mask properties are enhanced because after the mask, the UV does not have to pass through the film substrate material which carries the emulsion. In other words, the UV is masked by the film image in the emulsion immediately before entering the UV sensitive layer. A possible disadvantage of the dry silver film in this process is that it exhibits lower contrast than strip base film developed by conventional chemistry. In addition, while the developed dry silver film is inspectable on board before UV exposure, it cannot be easily retouched.

Figure 1C:
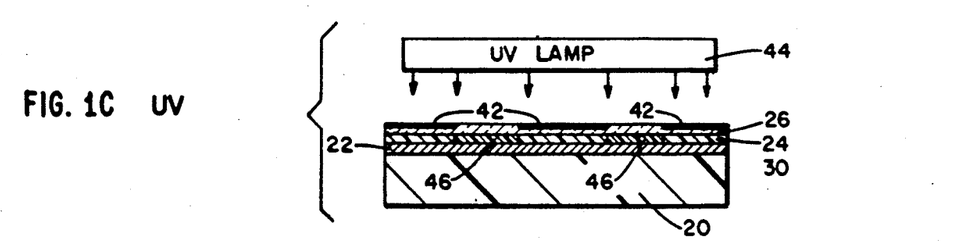

After the image 42 is fixed in the film 26, the composite structure 30 is exposed to a UV flood lamp 44, as shown in FIG. 1C. The darkened areas 42 in the image of the film 26 absorb the ultraviolet light and shield the underlying resist. Where the film 26 remains transparent, however, the ultraviolet light passes to the resist layer 24 and polymerizes the underlying portions 46. In practice, it is believed to be desirable to use a short burst of UV energy from a flash lamp to yield more uniform polymerization.

Figure 1D:
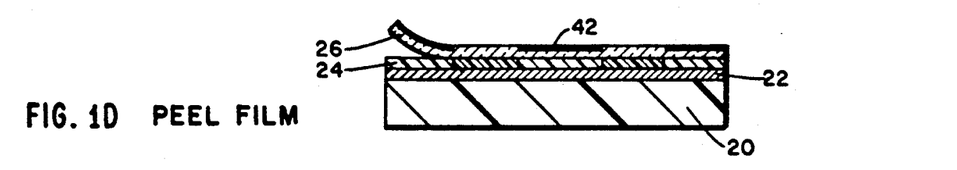
Figure 1E:
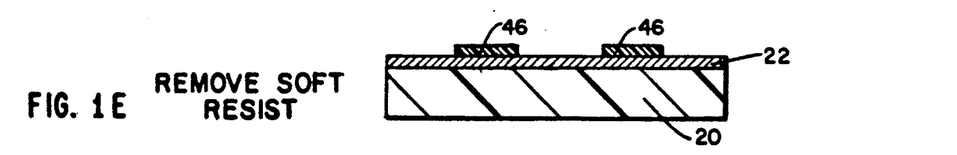
Figure 1F:
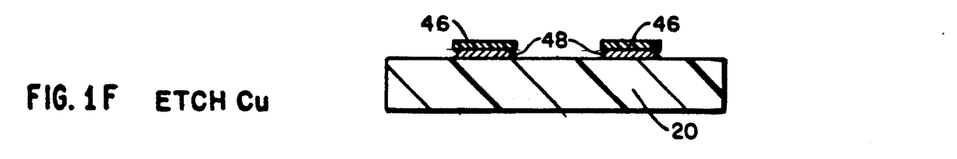
Figure 1G:
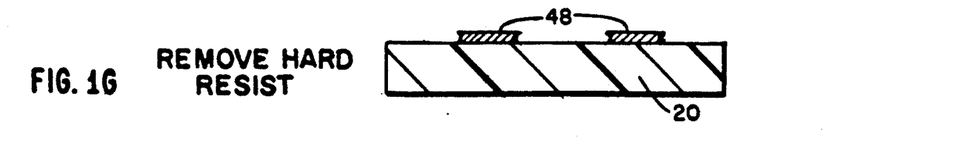

After the board is removed from the UV exposure apparatus 44, the next step, as shown in FIG. 1D, is to peel off the film 26. Once the film 26 is removed, the patterned photoresist 24 is uncovered. The remainder of the processing of the substrate is by conventional means (resist development, etching or plating, etc.). As shown, for example, in FIGS. 1E, 1F and 1G, the unpolymerized portions of the photoresist 24 may be removed by chemical action leaving only the polymerized portions 46 over selected areas of the copper layer 22. Next, the copper is etched to form copper conductor patterns 48 and, as shown in FIG. 1G, the polymerized portions of the resist 46 are chemically removed leaving the copper conductor patterns 48 specified by the original CAD design.

Figure 4A:
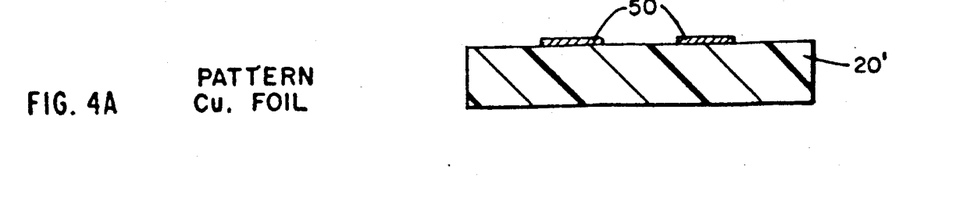
FIGS. 4A–4F are diagrammatic cross-sectional views of a printed wiring board undergoing application of permanent dry film patterned in a sequence of steps according to the invention.
Figure 4B:
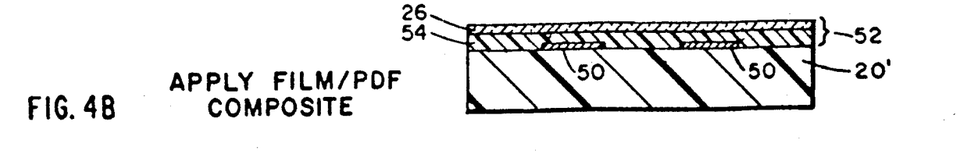

The present invention is also applicable to the preparation of solder masks and insulating layers. As shown in FIGS. 4A–4E, a copper foil clad substrate 20' of epoxy fiberglass or other suitable material is patterned using a conventional technique or the technique of the invention shown in FIGS. 1A–1G. The conductor foil pattern 50 is shown in FIG. 4A. A composite 52 of strip base silver film 26 and permanent dry film (PDF) 54, roll-laminated together in the manner of FIG. 2, is applied directly to the substrate 20' covering the conductive pattern 50. Alternatively, the PDF 54 can be applied first to form a coated substrate to which the film 26 is then applied in the manner of FIG. 3.

Figure 4C:
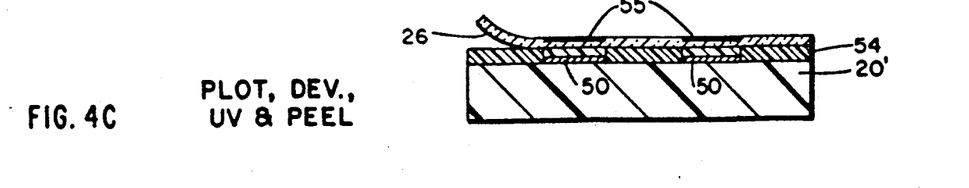
Figure 4D:
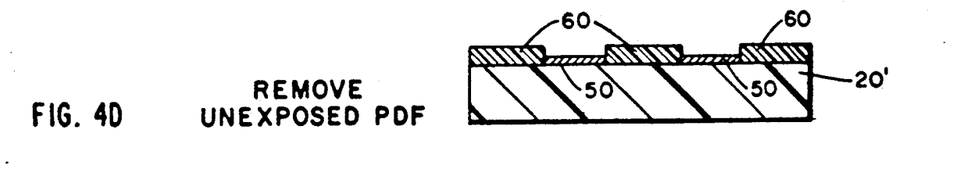

As shown in FIG. 4C, the composite covered structure is subjected to the same steps as shown in FIGS. 1A, 1B, 1C and 1D. The direct from CAD plotted image 55 formed in the emulsion layer of the film 26 selectively shields the underlying regions of the PDF over the conductive foil pattern 50, serving as an in situ mask. In FIG. 4D, the unexposed unpolymerized areas of the PDF over the conductive pattern 50 are removed chemically leaving the polymerized hardened PDF insulating layer 60.

Figure 4E:
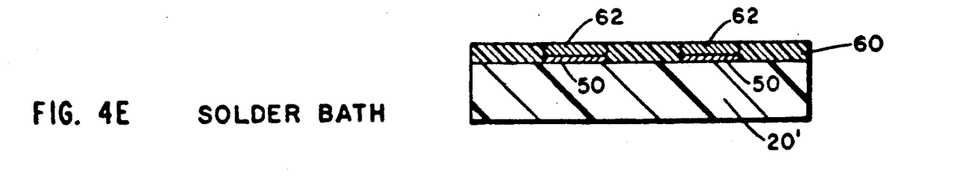

The exposed metal sites in FIG. 4D may be coated with solder by immersion in a molten solder bath to fill up the voided channels or apertures in the insulating layer 60 with solder 62 (FIG. 4E). To achieve a flush surface, the top layer of the structure is exposed to a hot air knife which reflows the top surface of the solder 62. The result is a smooth surface ready for the attachment of SMD's. In practice, solder paste is screened onto the surface of the structure in FIG. 4E, the SMD's are mounted and the structure is heated in a vapor phase process, for example, to form electrical connections between the board conductors and the SMD's.

Figure 4F:
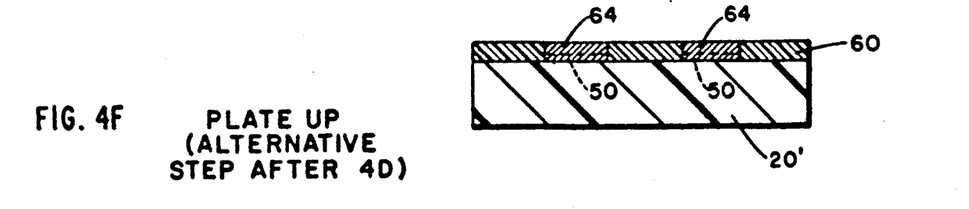

As shown in FIG. 4F, alternatively, the PDF can be employed as an interlayer insulator in multilayer structures of the type disclosed in our above-referenced copending multilayer application. The copper foil pattern 50 of FIG. 4D forms catalytic sites for electroless plating. The channels formed in the PDF insulating layer 60 are plated up electrolessly to make solid copper conductors 64 (FIG. 4F). Subsequent layers would be applied on top of the structure shown in FIG. 4F to build up a multilayer circuit.

Figure 5A:
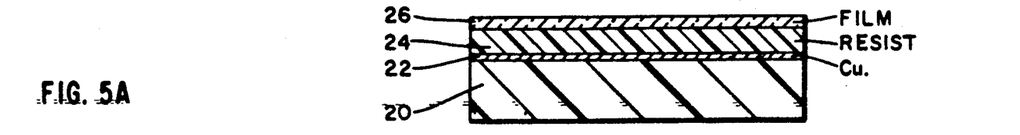
FIGS. 5A–5F are diagrammatic cross-sectional views of a patterning sequence according to the invention utilizing the standard pattern plating process.

A pattern plating method is shown in FIG. 5A–5F employing the direct from CAD in situ photo-mask technique of the present invention. As shown in FIG. 5A, a substrate 20 carries an upper layer of foil 22, a resist layer 24 and an image developing film layer 26. The configuration is identical to that shown in FIG. 1A, except that, when using a negative working resist, the film is preferably a negative-type strip base film rather than a positive-type strip base film as shown in FIG. 1A.

Figure 5B:
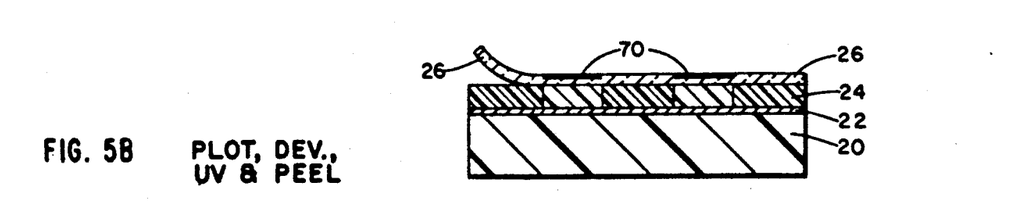

The film layer is exposed (plotted) and developed on the board as shown in FIG. 5B to produce the image 70. The board is then exposed to a UV source to polymerize the unshielded portions of the resist layer 24. As indicated in FIG. 5B, the film 26, having served its purpose, is peeled off and discarded. Next, the unpolymerized resist is removed in FIG. 5C leaving areas of hardened resist 72 above the uniform layer of copper 22.

Figure 5C:
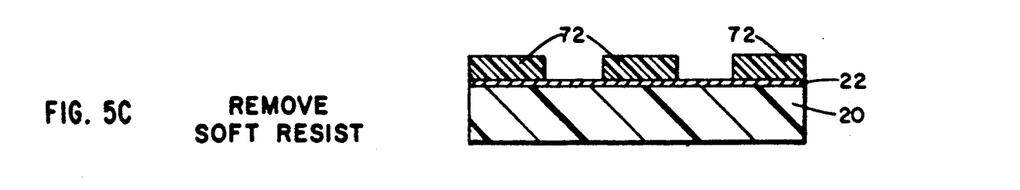

Because the copper layer is intact, electroplating can be employed. Through holes (not shown) are plated along with the copper channels exposed through the resist. Those areas covered by resist 72 are not affected by electroplating. This is advantageous since, as only the conductor pattern (and holes) are plated, there is no extraneous electroplated copper to be removed.

Figure 5D:
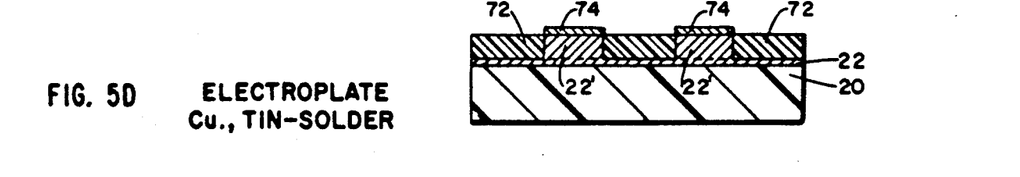
Figure 5E:
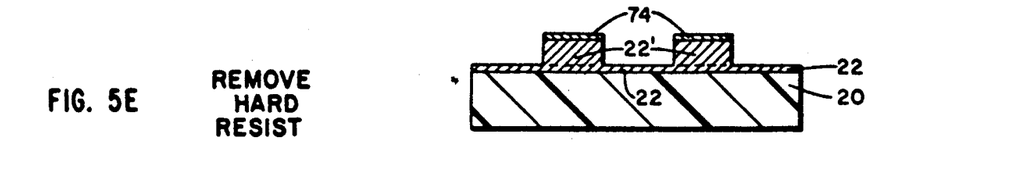
Figure 5F:
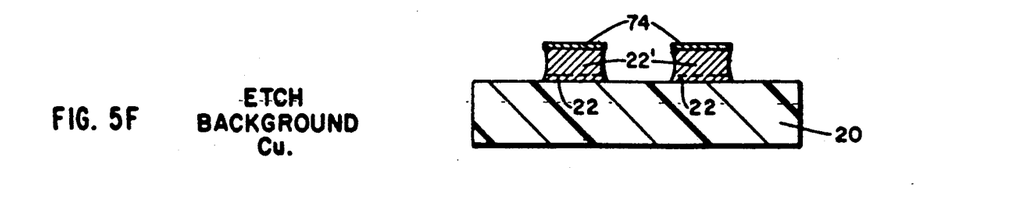

As shown in FIG. 5D, after the copper conductors 22' are electroplated, a coating 74 of tin-solder is electroplated in an appropriate bath onto the upper surface of the copper conductors 22'. The tin-solder coating 74 clads the desired conductor pattern. After removing the hardened polymerized resist 72 as shown in FIG. 5E, the structure is placed in an etching bath. The tin-solder coating 74 acts as a resist to the copper etchant. As a result, the copper foil layer 22 is removed everywhere except where the pattern has been plated with tin-solder, thus leaving the desired tin-clad copper pattern as shown in FIG. 5F. Following the final step illustrated in the drawing (FIG. 5F), the structure is heated by IR or hot oil treatment to reflow the tin-solder layer 74 over the etched edges 76 (FIG. 5F) of the copper pattern.

The advantages of direct from CAD photo-plotting onto an in situ silver film mask are numerous. In particular, a very thin high contrast in situ film mask yields high resolution patterning capability far exceeding direct from CAD UV plotting of the resist. Direct from CAD exposures can be performed using standard low cost white light photoplotters as opposed to high cost complex UV plotting systems requiring high energy UV lasers which need frequent replacement. Moreover, high contrast white light plotting is superior to UV plotting because light sensitive film exhibits higher contrast at lower energy levels.

The photoplotted in situ mask provides the basis for high precision interlayer registration and multilayer printed wiring boards. The film exposure is inspectable and stable prior to resist exposure.

Inspectability is a particularly important advantage over UV plotting. An error or artifact in the UV polymerized pattern cannot easily be surgically removed. Instead, the resist must be dissolved away and reapplied after cleaning and drying the board, or the board must simply be discarded. In manufacturing electrolessly plated multilayer boards with the process disclosed in the above-referenced copending application, the consequences of misplotting UV sensitive PDF layers are serious indeed. Using the present process, however, the onboard developed film can be easily checked for artifacts produced by a plotting glitch, hair, dust, etc. In many cases instead of peeling the old film off and reapplying new film, the in situ photo-mask can be retouched by using a UV opaque fountain pen or by excising tiny portions of falsely exposed emulsion with an exacto knife. In any event, if necessary, the bad mask can be quickly peeled off to try again with a new piece of film. The important difference is that the UV sensitive layer remains undisturbed even though the board is directly plotted from a CAD layout.

The system can be further adapted to a high speed raster scan system for production use without any of the limitations of current laser equipment. A white light source under consideration is a Xenon strobe lamp, beam collimated.

Figure 6A:
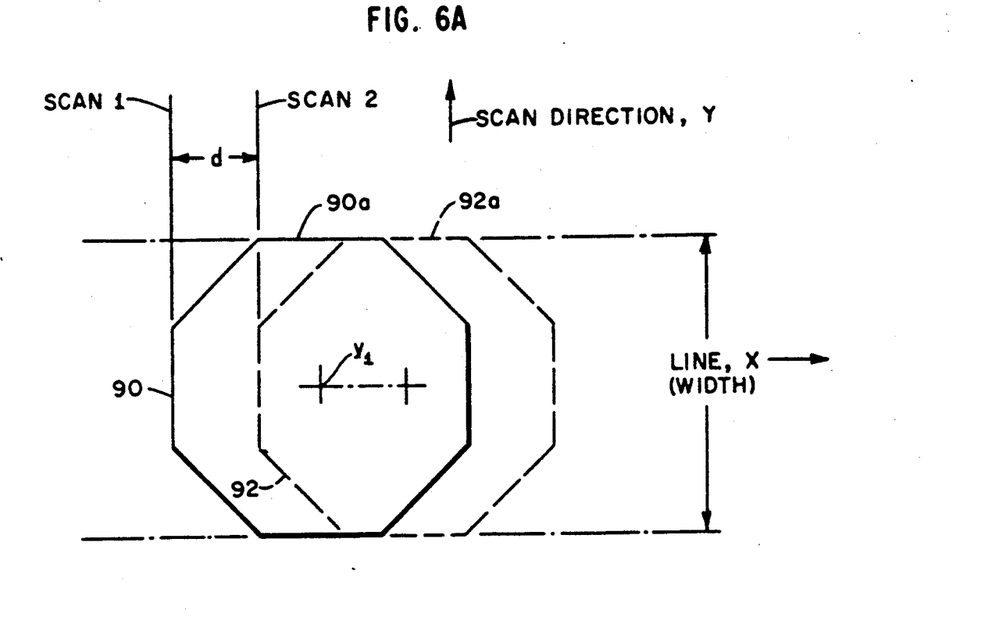
FIGS. 6A–6B are diagrammatic representations of an equilateral octagonal spot raster scan photoplotter according to the invention.
Figure 6B:
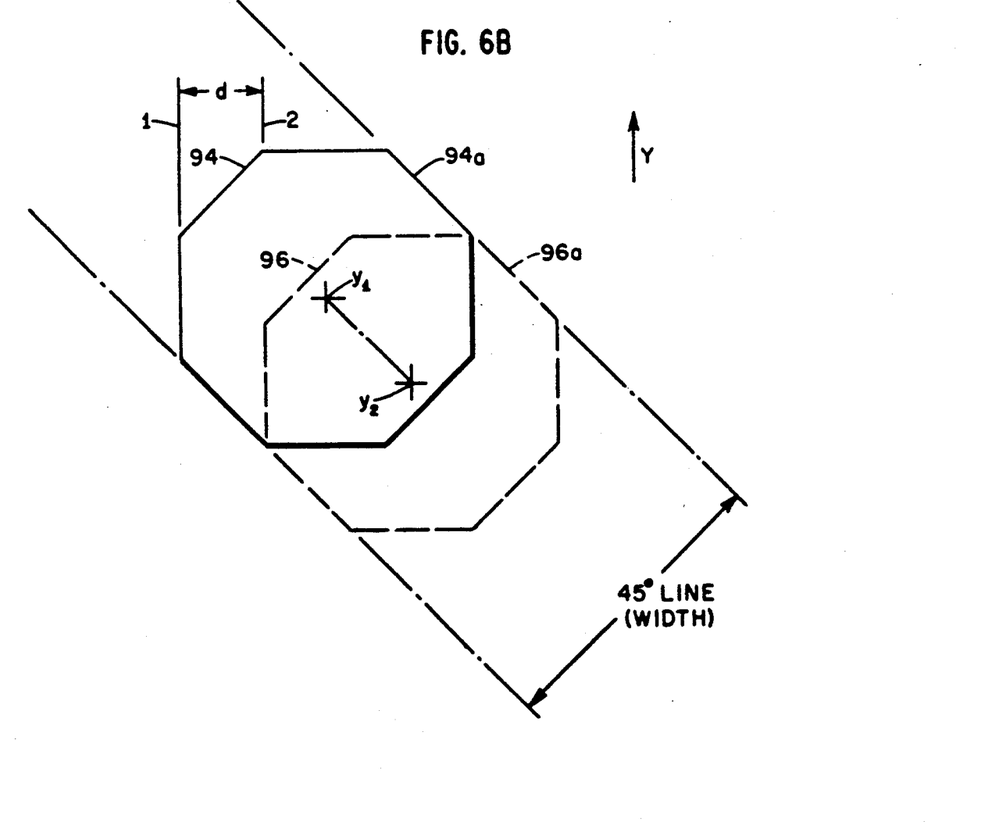

The use of an octagonal aperture for the raster scan beam eliminates any edge irregularity on both 45° and 90° lines, as well as 0° lines, i.e., parallel to the scan direction. As shown in FIG. 6A and 6B, a raster scan plotter can be equipped with a simple white light source with an octagonal aperture preferably in the form of a stencil. The octagonal spot is focused on the emulsion in the film. In FIG. 6A, the scan direction is along the y axis as indicated and the objective is to draw or image a line in the x direction. To accomplish this, the strobe lamp is triggered at precisely the correct y coordinate ($y_1$ in FIG. 6A) to expose an octagon 90 on the film during a first scan. In the next scan, the strobe lamp is flashed, again at position $y_1$, to expose a second octagon image 92 as shown. The interscan spacing, is approximately one-third of the width of the octagon as shown so that the sides 90a and 92a, for example, are aligned and touching or just overlapping. After consecutive scans, the resulting staggered, overlapping octagons plot a line with well delineated, straight edges. In addition, as shown in FIG. 6B, diagonal lines on 45° angles also result in patterns with straight edges 94a, 96a formed by octagon spots on successive scans in the y direction spaced at one-third spot widths.

Figure 7A:
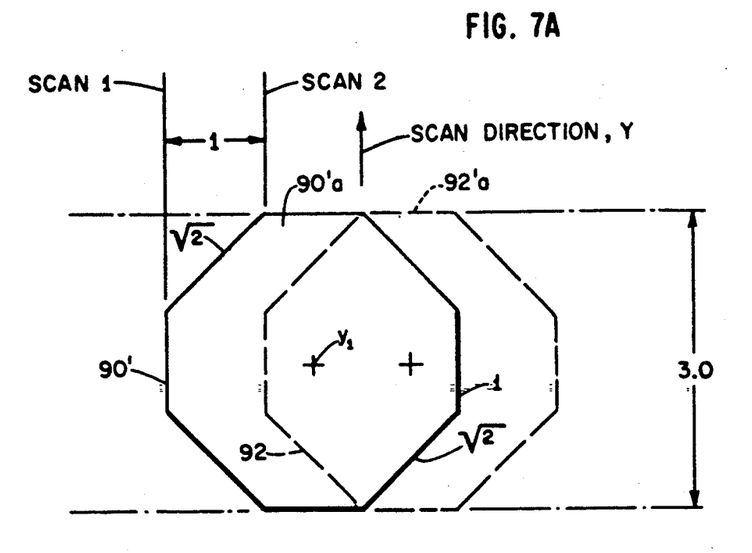
FIGS. 7A–7B are diagrammatic representations of a nonequilateral octagonal spot raster scan photoplotter according to the invention.
Figure 7B:
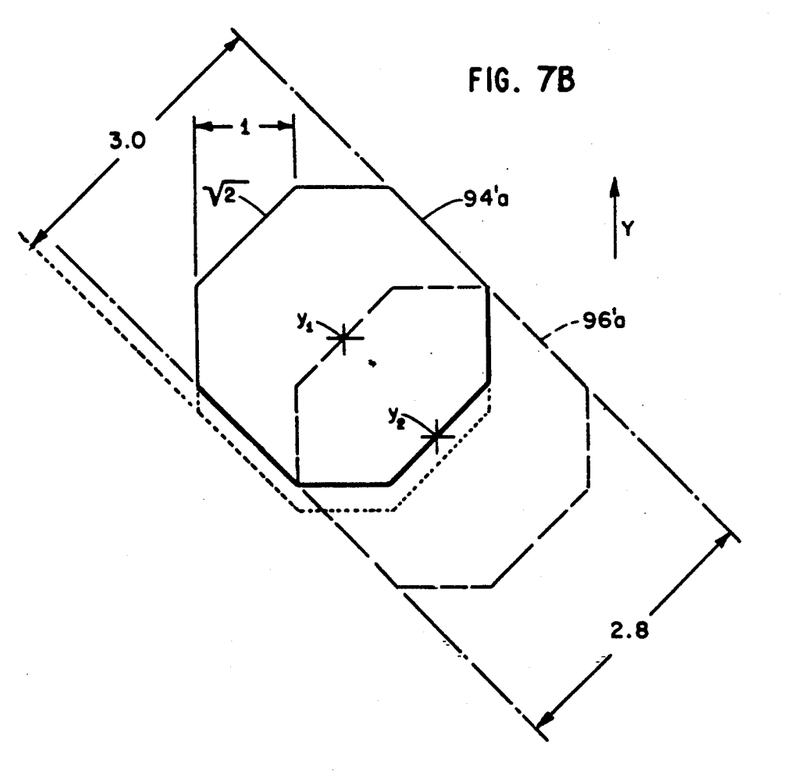

As the octagons shown in FIGS. 6A and 6B are equilateral or regular octagons, the amount of overlap at the sides is greater for the 90° path (FIG. 6A) than for the 45° path (FIG. 6B). This effect can be eliminated by employing diagonal sides, relative to the scan direction, in equal lengths which bear a ratio of approximately the square root of two to the orthogonal sides as shown in FIGS. 7A and 7B. In this design, the octagon will be evenly divided into thirds so that the overlap will be identical when making diagonal and orthogonal lines. However, if the width of the orthogonal line is 3 units, the width of the resulting diagonal line would be 2.828 units. The widths could be made equal, however, by changing the magnification if the raster plotter had an automatic zoom lens, for example, or by proper adjustment of the duration of the exposure to allow the light to sweep out a slightly extended octagon in the Y-direction to compensate for its diminished diagonal width when constructing diagonal lines.

Existing raster systems including the foregoing refinements and the in situ silver film mask system will yield a practical high quality substrate manufacturing process with production speeds realistically approaching five seconds per plot.

Figure 8:
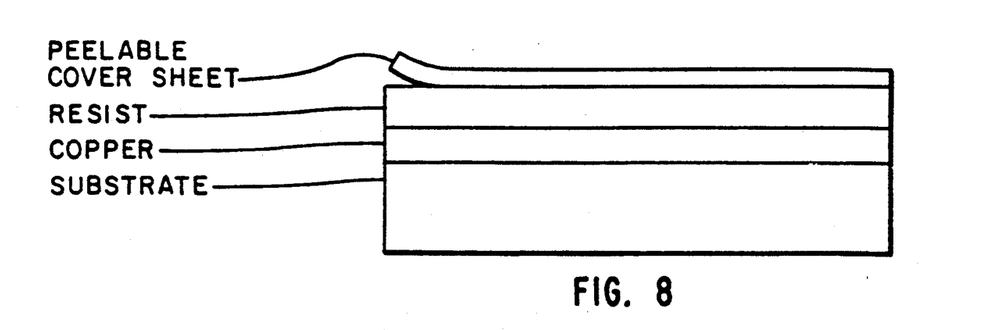
FIG. 8 is a diagrammatic cross-sectional view of a PWB with a cover sheet.
Figure 9A:
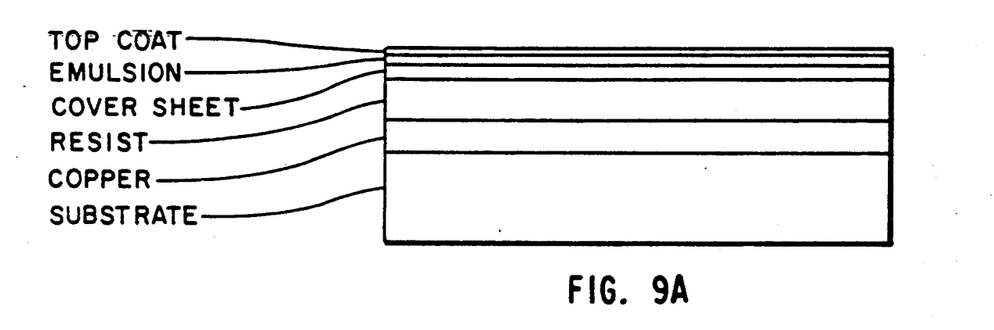
FIG. 9A and 9B illustrate a PWB with an emulsion-coated cover sheet before and after resist exposure, respectively.
Figure 9B:
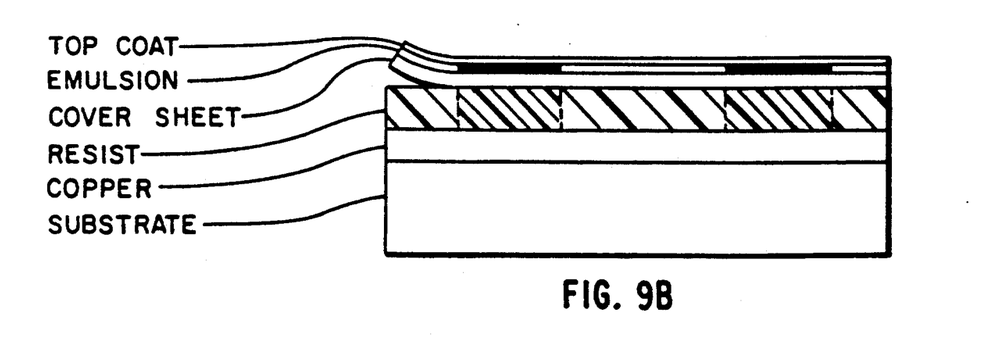

Further methods of optimizing the application of the photographic imaging layer to the resist-coated substrate are illustrated in FIGS. 8-17F. The sticky uncured resist is protected by a thin, peelable cover sheet typically made of polyester as shown in FIG. 8. This cover sheet, transparent to UV, remains in place until after UV exposure. After actinic polymerization, the cover sheet is removed so that the soft portions of the resist can be dissolved away. This cover sheet can be employed as a release vehicle for the in situ photographic imaging layer as shown in FIGS. 9A and 9B. An emulsion layer of dry silver bearing a thin nonstick transparent top coating is bonded directly to the resist cover sheet as shown in FIG. 9A. After photoplotting and developing the image in the emulsion layer, and subsequent UV exposure, the cover sheet emulsion layer and top coat are peeled off in one piece as shown in FIG. 9B.

Figure 10:
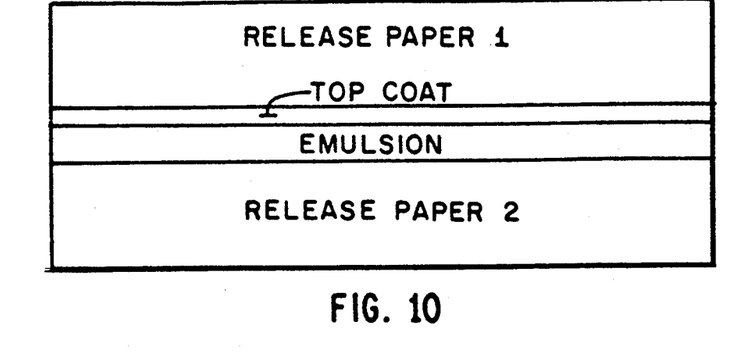
FIG. 10 is a diagrammatic cross-sectional view of one embodiment of an emulsion/release paper composite.

FIGS. 10-15 illustrate three different systems for applying the emulsion layer to the resist cover sheet. In FIG. 10, a composite flexible multilayer laminate is formed by sandwiching the top coated emulsion between two sheets of release paper (1 and 2) each having a silicone or other release agent coated on the inside surface.

Figure 11:
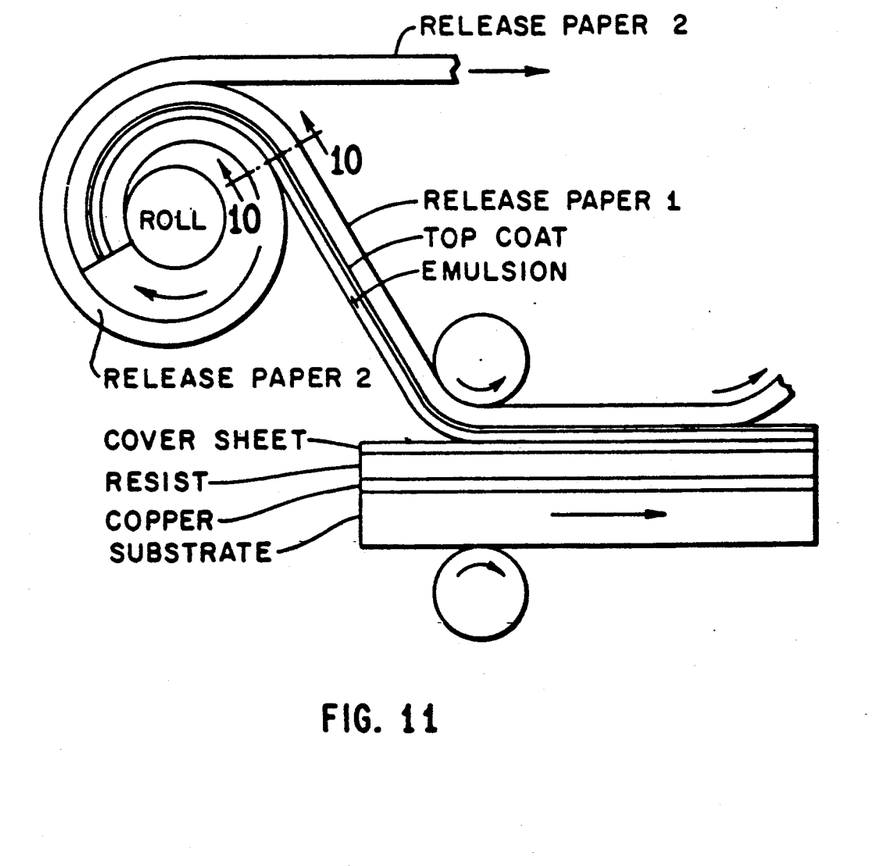
FIG. 11 is a schematic functional representation of a system for applying the emulsion layer directly to the cover sheet of a resist coated substrate using the composite of FIG. 10.

The multilayer laminate of FIG. 10 may be wound on a drum or roll as shown in FIG. 11. The paper covered emulsion/laminate is pulled off of the roll and the lower release paper No. 2 is stripped or peeled away as shown in FIG. 11 so that the emulsion layer can be applied directly to the cover sheet between a pair of rollers as shown. The upper roller presses down on the upper surface of release paper No. 1 while the lower roller presses up on the bottom surface of the resist coated substrate. After bonding the emulsion layer to the cover sheet, the upper release paper No. 1 may be removed by peeling as shown in FIG. 11 to prepare the board for photoplotting.

Figure 12:
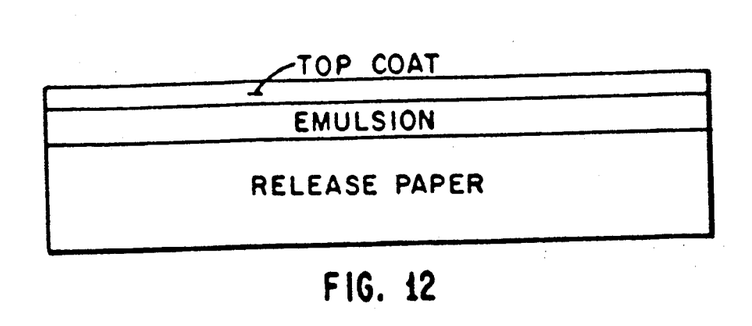
FIG. 12 is a diagrammatic cross-sectional view of another embodiment of an emulsion/release paper composite.
Figure 13:
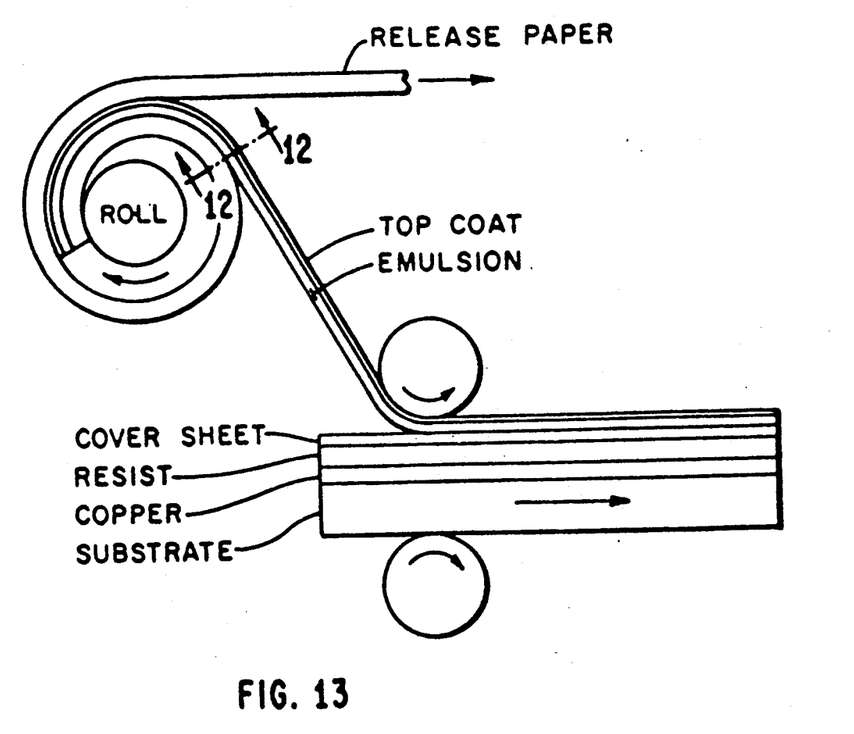
FIG. 13 is a diagrammatic functional representation for applying the emulsion layer directly to the cover sheet of a resist-coated substrate using the composite of FIG. 12.

FIG. 12 shows a variation on the system of FIGS. 10 and 11 in which the emulsion side is covered by a sheet of double-sided release paper, i.e., having a release coating on both sides. When wound on a roll as shown in FIG. 13, the exterior side of the release paper comes into contact with the top coat on the emulsion side. The paper-coated emulsion laminate is pulled off of the roll and the release paper is peeled away so that the emulsion layer can be bonded directly to the cover sheet between a pair of rollers. The upper roller contacts the protective top coat on the emulsion in this instance.

Figure 14:
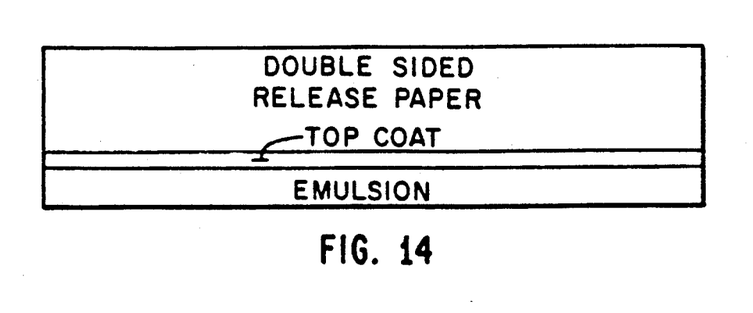
FIG. 14 is a diagrammatic cross-sectional view of a further embodiment of an emulsion/release paper composite.
Figure 15:
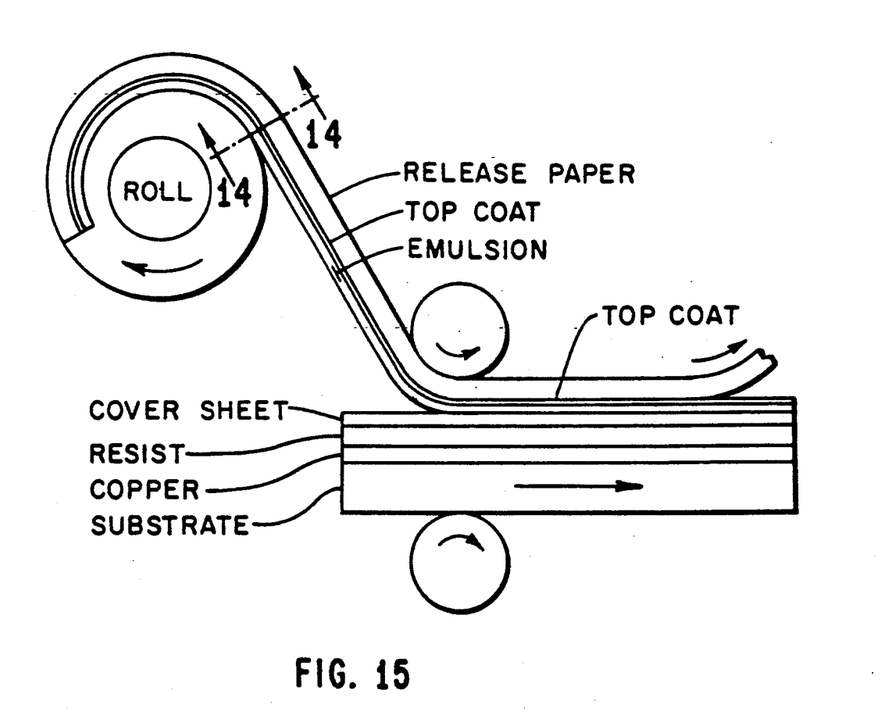
FIG. 15 is a diagrammatic functional representation of a system for applying the emulsion layer directly to the cover sheet of a resist coated substrate using the composite of FIG. 14.

FIGS. 14 and 15 show a third technique in which the release paper is applied to the top coated side of the emulsion layer. As shown in FIG. 14, the release paper is again double-sided so that the exterior side comes into releasable contact with the emulsion layer when the laminate is would on a roll as shown in FIG. 15. Unlike the other two systems of FIG. 11 and 13, in the case of FIG. 15, the release paper is not stripped before application to the board. Rather, the emulsion layer is bonded directly to the cover sheet between a pair of rollers, the upper one of which contacts the release paper. Before exposure, the release paper is removed as shown.

Figure 16:
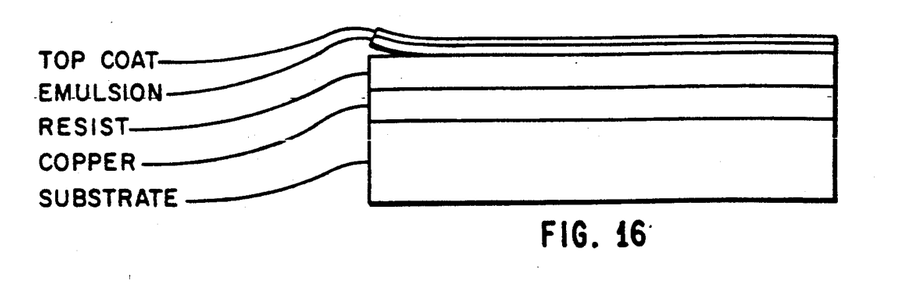
FIG. 16 is a diagrammatic cross-sectional view of a PWB having a releasable emulsion layer adherently applied directly to the resist layer.

The cover sheet does not have to be used as a release vehicle, of course, if the emulsion layer is "isotackifiable", meaning that the emulsion surface releasably adheres to the uncured sticky resist, but does not bond to the resist so that it remains peelable after UV exposure as shown in FIG. 16. Similar application systems to those shown in FIGS. 11, 13 and 15 can be used for applying the emulsion layer directly to the resist instead of to the cover sheet.

Figure 17A:
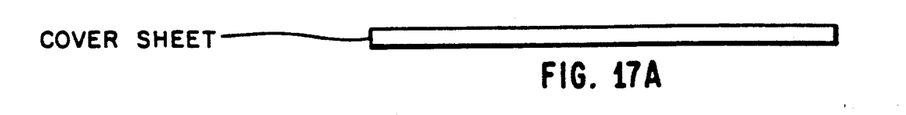
FIG. 17A–17D illustrate respective steps in the formation of a resist/emulsion/release paper composite in diagrammatic cross-sectional view, FIGS. 17E and 17F illustrating alternatives to the step of FIG. 17D.
Figure 17B:
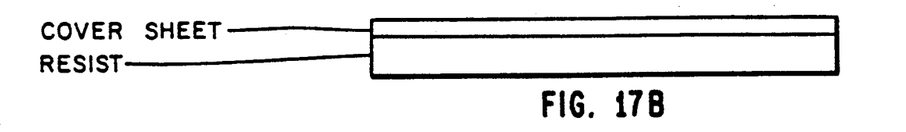
Figure 17C:
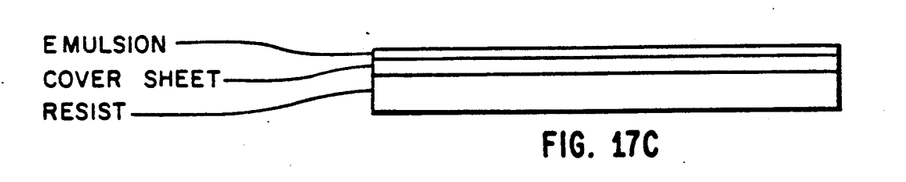
Figure 17D:
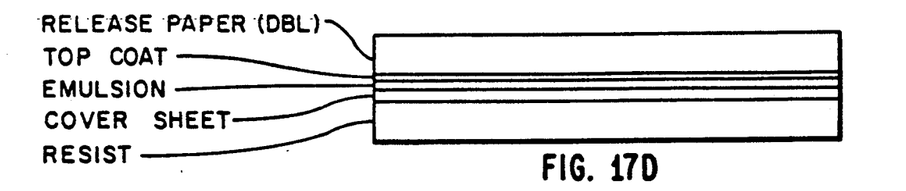
Figure 17E:
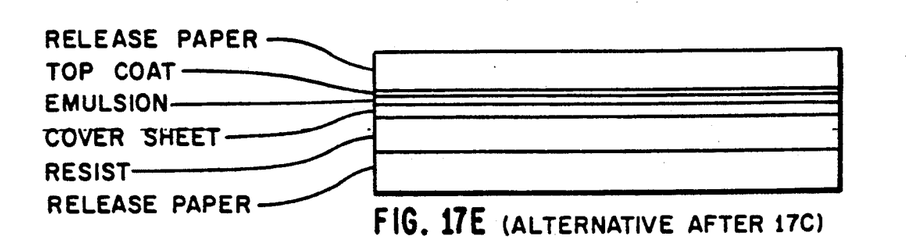
Figure 17F:
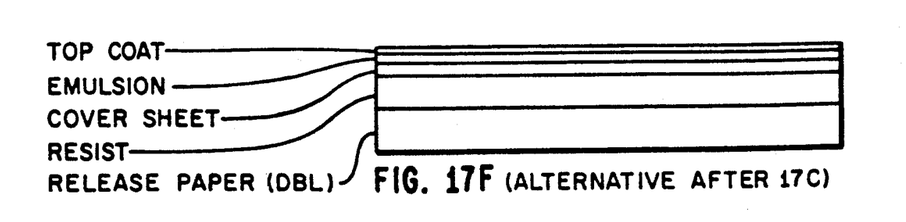

Instead of applying the emulsion layer to a covered or uncovered resist which has already been applied to a metal clad substrate, the resist and emulsion layer can be formed about the cover sheet as a composite structure. As shown in FIG. 17A and 17B, the process begins with an integral cover sheet of polyethylene or other suitable material. The uncured resist is applied to one side of the cover sheet in FIG. 17B. Next, the emulsion layer and top coat if necessary are applied to the other side of the cover sheet as shown in FIG. 17C. The three release paper options are illustrated in FIGS. 17D, 17E and 17F. The alternate resulting structures are applied directly to the metal clad board using the appropriate system of FIG. 11, 13 or 15 so that the emulsion-carrying resist is applied and bonded directly to the metal.

In each of the examples in FIGS. 8-17, a photopolymerizable permanent dry film or solder mask can replace the resist in which case the underlying layer of metalization may have already been patterned into conductors.

One of the advantages of the systems shown in FIGS. 9A-17F is that instead of using a photographic film having a base and an emulsion layer, the emulsion layer is used alone without a base. Thus, not only is the emulsion layer juxtaposed with the resist to reduce parallax and diffraction, but also the photoplotting light beam does not have to traverse the transparent base material before reaching the emulsion layer. In comparison with a photographic film base, the nonstick top coat is negligably thin.

The structure of FIGS. 10, 12 and 14 comprising an adherent baseless imaging emulsion on a release paper is believed to be unique. The emulsion should have high gamma and high contrast at low energy levels to enhance edge acuity. In the case of dry silver, the emulsion layer is a compound of thermoplastic and dry silver halide. Dry silver film has very low archivability because it fogs easily upon exposure to even moderate temperatures over a long period of time. Because of the high gamma, high contrast properties, gray scale is ideally substantially absent. The release paper facilitates transfer of this emulsion layer for temporary use as an in situ mask following which it is discarded.

The in situ mask system can accommodate positive or negative type strip base film. Since the majority of available resists used today are negative working, positive strip base film is preferred for subtractive processes. Negative-type strip base film would be used in an identical manner if the boards were fabricated using a pattern plating process as shown in FIGS. 5A-5F with negative working resist.

The foregoing description of the in situ film mask PWB system is intended to be illustrative and not restrictive. For example, although the foregoing examples show only single sided boards, double sided boards can be made by applying the same process simultaneously or in sequence to both sides of a substrate. Many variations on or additions to the steps or materials described herein are, of course, possible without departing from the principles or spirit of the present invention, the scope of which is indicated by the appended claims and their equivalents.

We claim:
1. A photopatternable composite, comprising
   a photopolymerizable layer between a release paper and a baseless emulsion layer having high gamma and high contrast at low energy exposure, the release paper being peelable from said photopolymerizable layer, said photopolymerizable and emulsion layers being separated by a cover sheet peelably releasable from said photopolymerizable layer.
2. The composite of claim 1, wherein said release paper is double-sided.
3. A method of making a photopatternable composite comprising
   applying a photoprocessable layer sensitive to a first spectrum of directed energy to one side of a strippable cover sheet transparent to said first spectrum, applying to the other side of said cover sheet a baseless adherent emulsion layer having high gamma and high contrast at low energy exposure to which said photoprocessable layer is relatively insensitive and removable from said photoprocessable layer along with said cover sheet, and applying a strippable release paper to one side of the composite formed of said cover sheet, photoprocessable layer and emulsion layer.

4. The method of claim 3, further comprising applying another strippable release paper to the other side of the composite comprising said cover sheet, emulsion layer and photoprocessable layer.

* * * * *